(12) United States Patent
Yu et al.

(10) Patent No.: US 11,415,276 B2
(45) Date of Patent: Aug. 16, 2022

(54) FLEXIBLE LIGHT STRIP MADE OF FLUORESCENT MATERIAL

(71) Applicant: GUANGDONG OML TECHNOLOGY CO., LTD, Zhongshan (CN)

(72) Inventors: Qianglong Yu, Zhongshan (CN); Chao Deng, Zhongshan (CN); Guangyu Fu, Zhongshan (CN)

( * ) Notice: Subject to any disclaimer, the term of this patent is extended or adjusted under 35 U.S.C. 154(b) by 0 days.

(21) Appl. No.: 17/385,928

(22) Filed: Jul. 27, 2021

(65) Prior Publication Data

US 2022/0146060 A1    May 12, 2022

(30) Foreign Application Priority Data

Nov. 10, 2020    (CN) .......................... 202022599764.0

(51) Int. Cl.
| | | |
|---|---|---|
| *F21S 4/22* | (2016.01) | |
| *F21V 23/00* | (2015.01) | |
| *F21Y 115/10* | (2016.01) | |

(52) U.S. Cl.
CPC .............. *F21S 4/22* (2016.01); *F21V 23/005* (2013.01); *F21Y 2115/10* (2016.08)

(58) Field of Classification Search
CPC ........ F21S 4/22; F21V 23/005; F21Y 2115/10
See application file for complete search history.

(56) References Cited

U.S. PATENT DOCUMENTS

| | | | | |
|---|---|---|---|---|
| 2011/0018440 | A1* | 1/2011 | Fukuda | G11B 33/025 315/77 |
| 2013/0107514 | A1* | 5/2013 | McNabb | F21V 9/00 362/231 |
| 2014/0085896 | A1* | 3/2014 | Li | F21V 21/005 362/249.04 |
| 2015/0069442 | A1* | 3/2015 | Liu | F21K 9/232 257/98 |
| 2017/0051878 | A1* | 2/2017 | Jiang | H01L 25/0753 |
| 2018/0299082 | A1* | 10/2018 | Li | F21V 19/004 |
| 2020/0284407 | A1* | 9/2020 | Li | F21V 23/001 |

* cited by examiner

*Primary Examiner* — Andrew J Coughlin
*Assistant Examiner* — Jessica M Apenteng

(57) ABSTRACT

Disclosed is a flexible light strip made of fluorescent material, including a substrate integrated with a plurality of flip-chips or LEDs arranged in parallel, wherein a phosphor outer layer is wrapped around the substrate, and a cross section of the phosphor outer layer is rectangular or arc-shaped, etc. In the present application, the substrate is wrapped with a flexible phosphor outer layer to achieve its own target color temperature, which simplifies the processing technology and brings the advantage of uniform light emission at the same time. The distance between the light sources, the number of arrangements, and the thickness of the wrapping fluorescent material are controlled, so as to achieve the purpose of uniform light emission. Compared with the existing conventional uniform light emission schemes, the processing technology links are reduced, and the cost is effectively saved, thus the invention has good popularization.

5 Claims, 4 Drawing Sheets

FLEXIBLE LIGHT STRIP MADE OF FLUORESCENT MATERIAL

TECHNICAL FIELD

The present invention relates to the field of light strips, in particular to light strips made of fluorescent materials.

TECHNICAL BACKGROUND

There are three light emission schemes for uniform light-emitting LED light strips: 1. LED flexible neon light strip, which is LED patch flexible light strip combined with flexible diffusion material, and the uniform light emission of the light-emitting surface can be realized by controlling the comprehensive conditions such as the proportion of diffusant of the flexible diffusion material, the density of lamp beads and the distance between the diffusion material and the light-emitting surface of lamp beads, and this light strip can be sealed at both ends to be waterproof. 2. Traditional linear lights and other schemes, that is, a diffusion cover and a PCB lamp board are combined with a lamp body of various materials, and the uniform light emission effect of the light-emitting surface can be realized by controlling the comprehensive conditions such as the proportion of diffusant of the diffusion cover, the density of the lamp beads and the distance between the diffusion cover and the light-emitting surface of the lamp beads, and this light strip can be waterproof. 3. Novel COB flexible light strip, that is, the fluorescent material is attached to the FPC flexible circuit board with densely distributed light-emitting chips by processing technology, so that the uniform light emission effect of the light-emitting surface can be realized, and this light strip is not waterproof.

However, these three schemes have some defects. Scheme 1 is limited to its own characteristics: the lamp beads cannot be too close, and the overall scheme has a high process and material cost. Scheme 2 is also limited to its own characteristics: the lamp beads cannot be too close, the overall scheme has a high process and material cost, and the light strip can only be fixed. Scheme 3 is a new technology product, which has high technical cost and is not waterproof; epoxy or skin-wrapping is needed to make it waterproof, but the cost is further increased, and the price has no advantage.

SUMMARY OF THE INVENTION

In order to solve the problems in the prior art, the technical scheme provides a flexible light strip made of fluorescent material, which has few processing links and uniform light emission, and is waterproof and can effectively save cost.

To achieve the above purpose, the technical scheme is as follows:

A flexible light strip made of fluorescent material includes a substrate integrated with a plurality of flip-chips or LEDs arranged in parallel, a phosphor outer layer is wrapped around the substrate, and the cross section of the phosphor outer layer is rectangular or arc-shaped.

In the present application, phosphor is used to change the original luminous color temperature of flip-chips or LEDs, and the flip-chips or LEDs are integrated on the substrate and then completely wrapped by the outer layer of phosphor, which simplifies the processing technology and brings the advantage of uniform light emission. The distances between light-emitting chips are controlled to be 0.3 mm to 34 mm, the number of arrangements 30 pcs/m to 2000 pcs/m, and the thickness of the wrapped fluorescent material 1 mm to 30 mm, which achieves the purpose of uniform light emission. Compared with the existing uniform light emission schemes, the processing technology links are reduced, and the cost is effectively saved, thus the invention has good popularization.

In some embodiments, a gap is left between an upper end face of the phosphor outer layer and the flip-chips or LEDs, and the gap is 0.5 mm to 30 mm.

In some embodiments, a first positioning part is further provided on an inner wall of the phosphor outer layer above the substrate.

In some embodiments, the substrate is connected to a light blocking layer surrounding both sides and a lower side of the substrate, and the phosphor outer layer is arranged above the substrate and connected between portions of the light blocking layer on both sides of the substrate.

In some embodiments, a second positioning part is further provided on an inner wall of the light blocking layer above the substrate.

In some embodiments, sealing plugs are provided at both ends of the substrate.

In some embodiments, a positioning step for positioning the phosphor outer layer is provided in an inner cavity of each of the sealing plugs.

In some embodiments, the substrate is a flexible circuit board formed by splicing a plurality of circuit boards, the circuit boards are connected to each other by welding, and one side of the substrate is provided with a welding part welded with a power cord.

BRIEF DESCRIPTION OF DRAWINGS

In order to describe the technical schemes in the embodiments of the present invention more clearly, the drawings used in the description of the embodiments are briefly introduced in the following.

DETAILED DESCRIPTION OF THE INVENTION

In order to make the technical problems, technical schemes and beneficial effects solved by the present invention clearer, the present invention will be further described in detail with reference to the accompanying drawings and embodiments. It should be understood that the specific embodiments described here are only used to explain the present invention, and are not intended to limit the present invention.

Referring to FIGS. 1-4, Embodiment one provided by the present invention is as follows.

Figure 1:
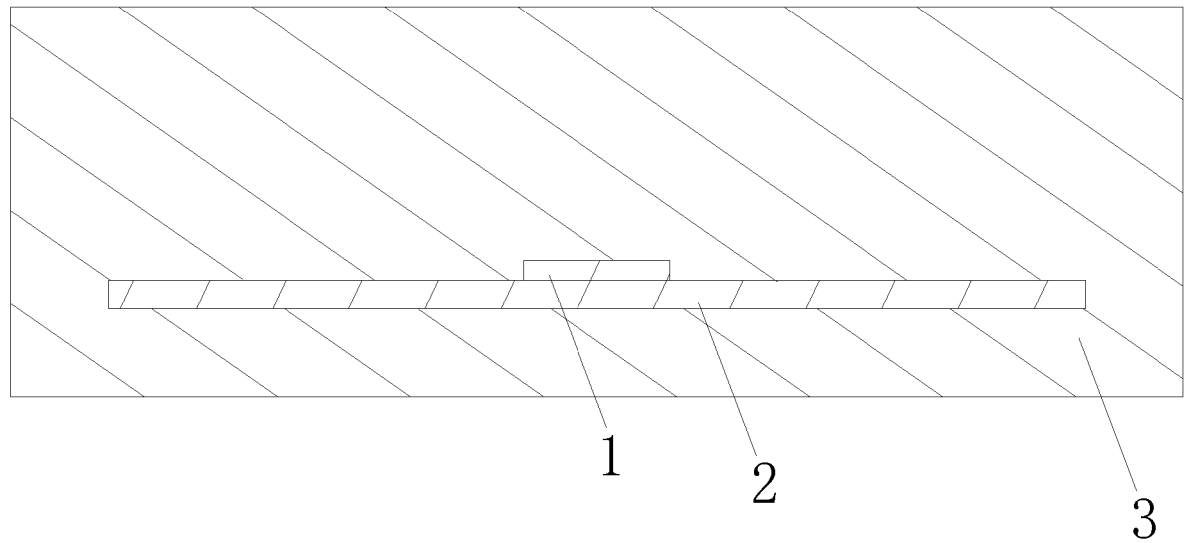
FIG. 1 is a schematic diagram I of a cross-sectional structure according to some embodiments of the present invention.

A fluorescent material flexible light strip includes a substrate 2 integrated with a plurality of flip-chips or LEDs 1 arranged in parallel, a phosphor outer layer 3 is wrapped around the substrate 2, and the phosphor outer layer 3 has a rectangular, arc-shaped or trapezoidal cross section or other irregular shapes. As shown in FIG. 1, the phosphor outer layer is completely coating outside the substrate by extrusion or epoxy, the flip-chips or LEDs are in direct contact with or separated from the phosphor outer layer, and various kinds of phosphor mixed materials with different proportions (supplemented by a little diffusion auxiliary materials) can be blended to change the luminous color temperature and achieve uniform luminescence, and the processing technology is mature, effectively reducing the cost.

Specifically, the flip-chips have the following characteristics: bonding wire is not needed, thus wire breakage is avoided; heat transfer channels are reduced, and wafer thermal resistance is reduced; for a five-sided light-emitting flip-chip with a ceramic substrate and three-dimensional full wrapping, it has large light emission angle, higher brightness, longer projection distance, no side light, no pad dark area on the front, no blue core yellow ring phenomenon, the best spatial color uniformity, and can bear larger driving current.

Figure 2:
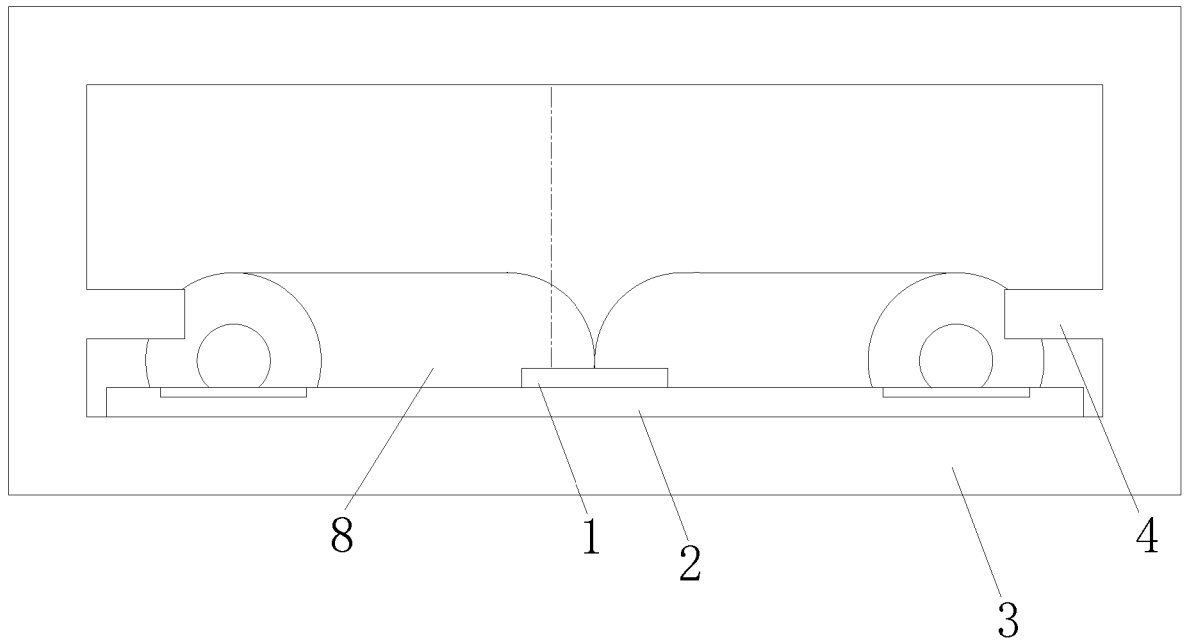
FIG. 2 is a schematic diagram II of a cross-sectional structure according to some embodiments of the present invention.

In Embodiment two, a gap is left between an upper end face of the phosphor outer layer 3 and the flip-chips and LED 1, and the gap is 0.5 mm to 30 mm. As shown in FIG. 2, the phosphor outer layer is not completely coated on the substrate, and a gap of 0.5 mm to 25 mm is left (as shown by the dashed line), which can reduce materials, and the setting of the gap can ensure brightness and achieve stable light emission at the same time.

In Embodiment two, a first positioning part 4 is further provided on an inner wall of the phosphor outer layer 3 above the substrate 2, and the first positioning part 4 can be used for embedding and positioning the substrate.

Figure 3:
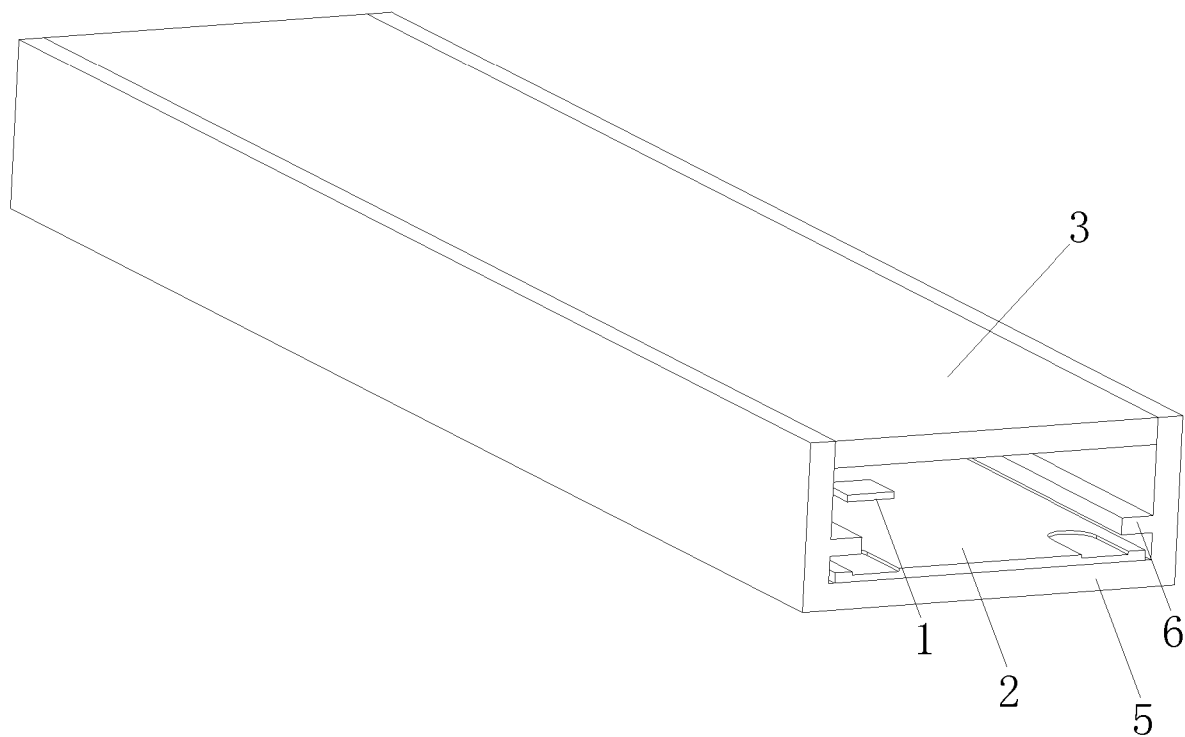
FIG. 3 is a schematic diagram of a structure according to some embodiments of the present invention.
Figure 4:
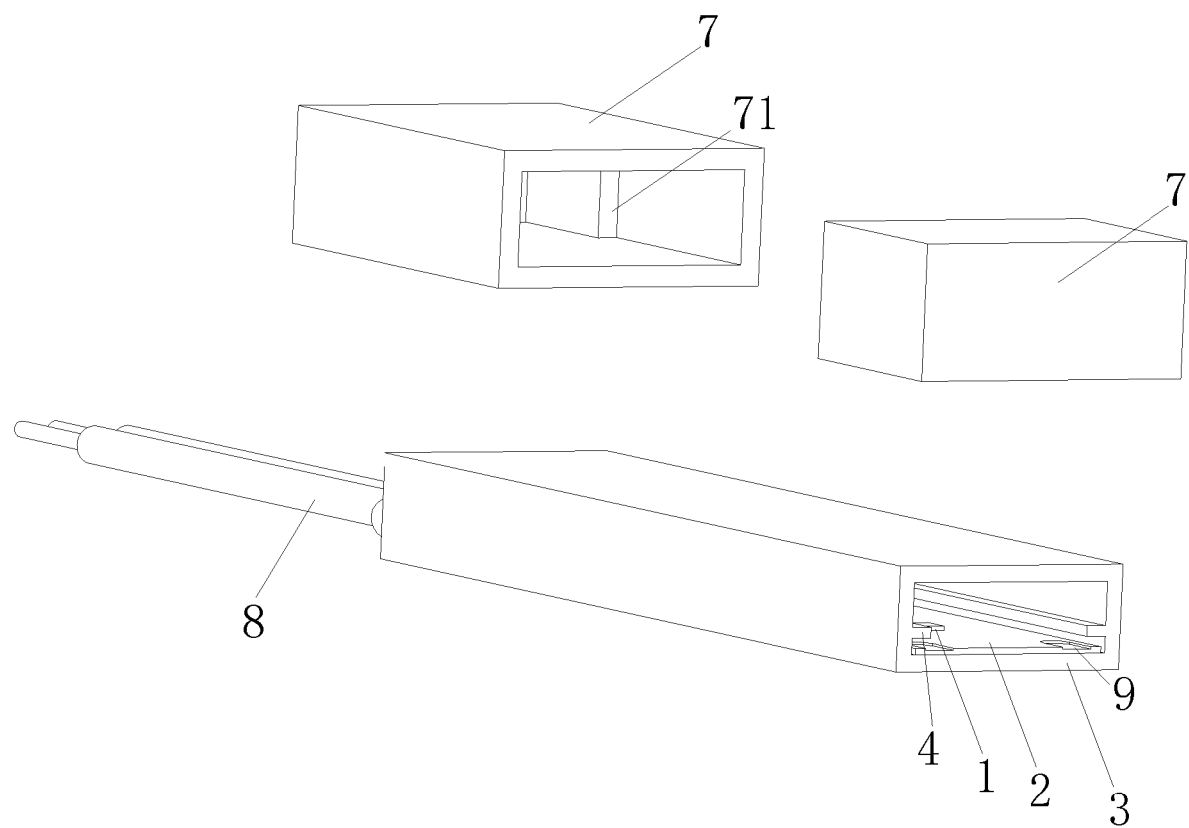
FIG. 4 is a schematic diagram of an exploded structure according to some embodiments of the present invention.

In Embodiment three, the substrate 2 is connected to a light blocking layer 5 surrounding, both sides and a lower side of the substrate 2, and the phosphor outer layer 3 is arranged above the substrate 2 and connected between portions of the light blocking layer 5 on both sides of the substrate 2. As shown in FIG. 3, the light blocking layer can be used to semi-surround the substrate, and phosphor can be used to cover the light-emitting surface of the chip, which further reduces the cost and can emit light on one side.

In Embodiment three, a second positioning part 6 is further provided on an inner wall of the light blocking layer 5 above the substrate 2, and the second positioning part 6 can be used for embedding and positioning the substrate.

As a preferred embodiment, sealing plugs 7 are provided at both ends of the substrate 2 for sealing both ends of the substrate to achieve a waterproof level of IP65 or higher. One of the sealing plugs can be sealed by gluing after the power cord passes through.

As a preferred embodiment, a positioning step 71 for positioning the phosphor outer layer 3 is provided in an inner cavity of each of the sealing plugs 7. The positioning step 71 is used for positioning and mounting the substrate and the outer layer, and the space between the positioning step and the sealing plug constitutes a space for bending the power cord, so as to prevent the power cord from falling off the substrate due to being too tight.

As a preferred embodiment, the substrate 2 is a flexible circuit board formed by splicing a plurality of circuit boards, the circuit boards are connected to each other by welding, and one side of the substrate 2 is provided with a welding part 9 welded with a power cord 8. After splicing a plurality of circuit boards, current transmission can be realized between the boards, replacing the power supply of copper wires, without opening a gap for copper wires to pass through, thus optimizing the production process. The design of the flexible substrate can also be customized according to the length requirements of users.

The above is only preferred embodiments of the present application, and are not intended to limit the implementation scope of the present application. Other implementations with principles and basic structures that are the same or similar to those of the present application shall fall within the protection scope of the present application.

The invention claimed is:

1. A flexible light strip made of fluorescent material, comprising a substrate integrated with a plurality of flip-chips or LEDs arranged in parallel, and arrangement distances between the flip-chips or LEDs are 0.3 mm to 34 mm;
   the substrate is connected to a light blocking layer surrounding both sides and a lower side of the substrate; the light blocking layer has a substantially U-shaped cross-section; and a phosphor outer layer is arranged above the substrate and connected between portions of the light blocking layer on both sides of the substrate, such that a rectangle tube structure is formed by the phosphor outer layer and the light blocking layer;
   a gap is arranged between the phosphor outer layer and the plurality of flip-chips or LEDs, such that the phosphor outer layer and the plurality of flip-chips or LEDs are separated by the gap;
   a second positioning part is further provided on an inner wall of the light blocking layer above the substrate; the second positioning part is configured to position the substrate.

2. The flexible light strip made of fluorescent material according to claim 1, wherein sealing plugs are provided at both ends of the substrate.

3. The flexible light strip made of fluorescent material according to claim 2, wherein a positioning step for positioning the phosphor outer layer is provided in an inner cavity of each of the sealing plugs.

4. The flexible light strip made of fluorescent material according to claim 1, wherein the substrate is a flexible circuit board formed by splicing a plurality of circuit boards, the circuit boards are connected to each other by welding, and one side of the substrate is provided with a welding part welded with a power cord.

5. The flexible light strip made of fluorescent material according to claim 1, wherein the phosphor outer layer has a rectangular, arc-shaped or trapezoidal cross section.

* * * * *